United States Patent [19]

Hu

[11] Patent Number: 6,010,961
[45] Date of Patent: Jan. 4, 2000

[54] METHODS OF ESTABLISHING ELECTRICAL COMMUNICATION WITH SUBSTRATE NODE LOCATIONS, SEMICONDUCTOR PROCESSING METHODS OF FORMING DYNAMIC RANDOM ACCESS MEMORY (DRAM) CIRCUITRY, AND SEMICONDUCTOR ASSEMBLIES

[75] Inventor: Yongjun Jeff Hu, Boise, Id.

[73] Assignee: Micron Technology, Inc., Boise, Id.

[21] Appl. No.: 09/031,095

[22] Filed: Feb. 26, 1998

[51] Int. Cl.[7] .................... H01L 21/4763; H01L 21/44
[52] U.S. Cl. .................... 438/655; 438/648; 438/649; 438/656; 438/664; 438/668
[58] Field of Search .................... 438/648, 649, 438/655, 656, 664, 668

[56] References Cited

U.S. PATENT DOCUMENTS

| | | | |
|---|---|---|---|
| 5,371,041 | 12/1994 | Liou | 437/192 |
| 5,747,384 | 5/1998 | Miyamoto | 438/685 |
| 5,793,111 | 8/1998 | Zamanian | 257/751 |

OTHER PUBLICATIONS

Kim, J.S. et al., "A Triple Level Metallization Technique for Gigabit Scaled DRAMs", VMIC Conference 1996 ISMIC—106/96/0028(c), Jun. 18–20, 1996, pp. 28–33.

Byun, Jeong Soo, "Epitaxial C49–TiSi$_2$ Formation on (100) Si Substrate Using TiN$_x$ and ITs Electrical Characteristics as a Shallow Contact Metallization", J. Electrochem. Soc., vol. 143, No. 6, Jun. 1996, pp. 1984–1991.

Carlsson, J. R. A. et al., "Effect of Lateral Confinement and Ti Thickness on the C49 to C54 TiSi$_2$ Phase Transformation in TiN/Ti Bilayers on Si (001)", Macintosh HD/Articles/1997/TiSi$_2$, Feb. 14, 1997, pp. 1–14.

Primary Examiner—Charles Bowers
Assistant Examiner—Nema Benezny
Attorney, Agent, or Firm—Wells, St. John, Roberts, Gregory & Matkin P.S.

[57] ABSTRACT

Methods of establishing electrical communication with substrate node locations, methods of forming DRAM circuitry, and semiconductor assemblies are described. In one implementation, a contact opening is formed over a substrate node location with which electrical communication is desired. The contact opening has a base over which a refractory metal layer is formed. A refractory metal silicide layer is formed over the refractory metal layer, and the substrate is exposed to conditions effective to convert the refractory metal layer to a refractory metal silicide. In one embodiment, the refractory metal layer and the refractory metal silicide layer are chemical vapor deposited. In another embodiment, the refractory metal silicide layer comprises a silicide of the refractory metal layer. In a preferred implementation, the refractory metal layer comprises titanium and the refractory metal silicide layer comprises titanium silicide. In another implementation, a composite layer is formed over a substrate and comprises an underlying refractory metal and an overlying silicide layer. The composite layer is annealed to react the underlying metal with a silicon-comprising substrate and form a refractory metal silicide of the underlying refractory metal in contact with the overlying silicide layer. The invention can achieve reductions in silicon consumption in the diffusion regions and maintain low source/drain diode leakage.

55 Claims, 3 Drawing Sheets

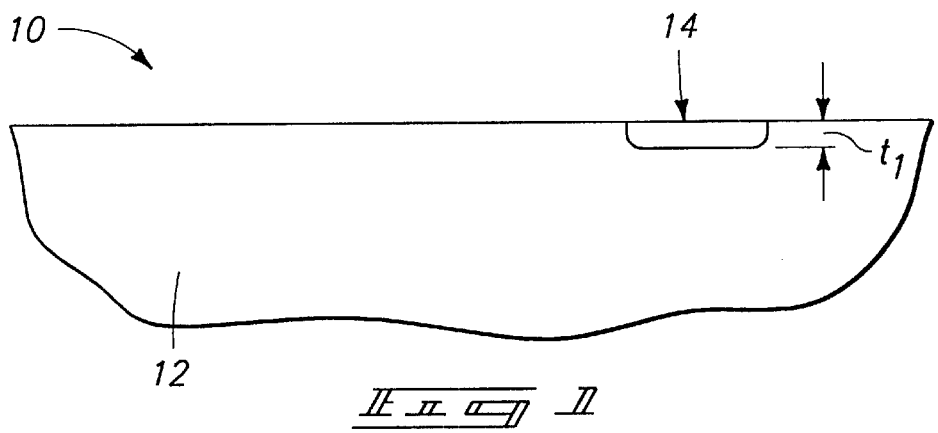
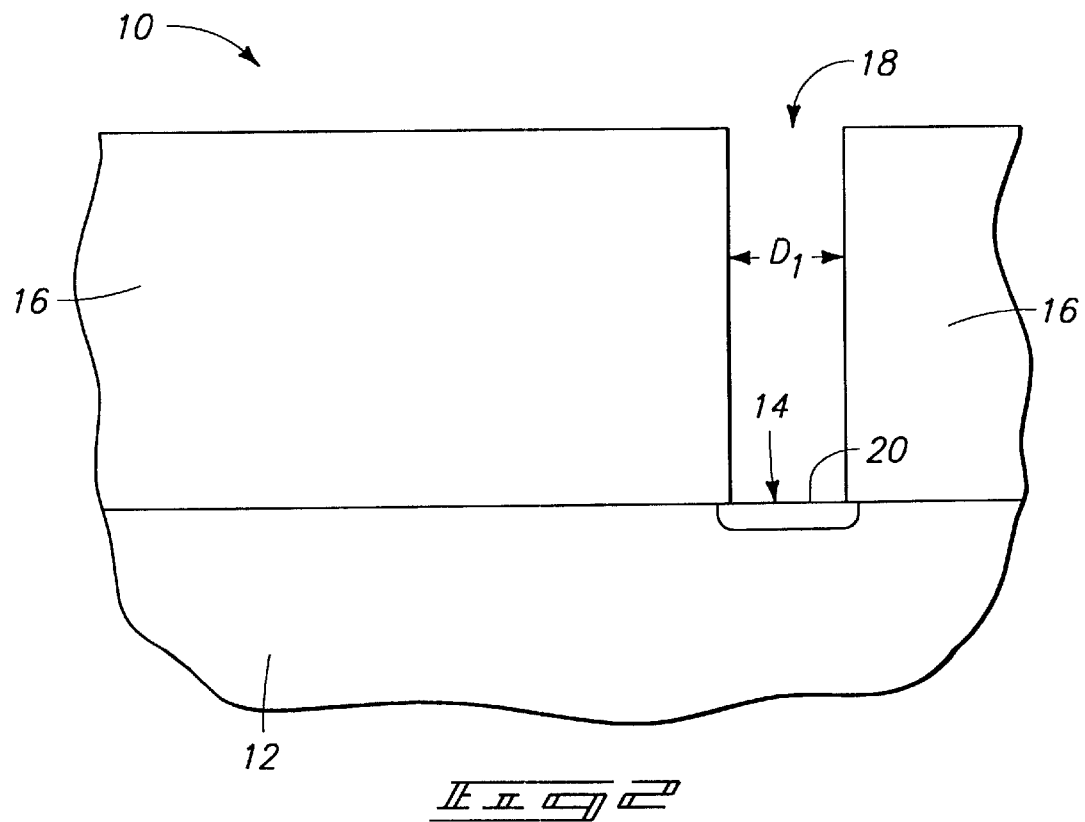

METHODS OF ESTABLISHING ELECTRICAL COMMUNICATION WITH SUBSTRATE NODE LOCATIONS, SEMICONDUCTOR PROCESSING METHODS OF FORMING DYNAMIC RANDOM ACCESS MEMORY (DRAM) CIRCUITRY, AND SEMICONDUCTOR ASSEMBLIES

TECHNICAL FIELD

This invention relates to methods of establishing electrical communication with substrate node locations, to semiconductor processing methods of forming dynamic random access memory (DRAM) circuitry, and to semiconductor assemblies.

BACKGROUND OF THE INVENTION

As semiconductor processing techniques push critical dimensions ever smaller, there are continuing challenges in forming adequate contacts with substrate node locations. For example, it is desirable in most instances to form diffusion regions to have a very shallow elevational thickness within a substrate. Yet, the act of establishing electrical connection with diffusion regions can diminish their size. Such typically happens where a silicide material is used to form an electrical contact to a diffusion region. This occurs because silicon is typically consumed by refractory metals when forming contact to silicon in the form of a silicide. As diffusion region thicknesses shrink, less silicon is available for consumption by the refractory metal. In some instances, an entire diffusion region can be consumed if too much refractory metal is reacted with the silicon, thus destroying the circuitry.

One solution to this problem would be to provide very thin refractory metal layers over diffusion regions with which electrical communication is desired. This approach, however, can lead to problems associated with the structural integrity of the ultimately-formed silicide layer. Specifically, silicide layers have grain sizes which are usually within known ranges. As an example, titanium silicide can have grain sizes from between 200 and 400 Angstroms. Accordingly, where very thin layers of titanium, e.g. 50 Angstroms, are formed over a silicon surface, the resulting silicide will attempt to, and effectively form grain sizes between 200 and 400 Angstroms. As the titanium layer is insufficiently thick to produce grains of this size and maintain complete coverage of the underlying silicon, what can occur is formation 200 Angstrom to 400 Angstroms grains which in essence can result in less than all of the exposed silicon being covered with titanium silicide.

This invention arose out of concerns associated with improving the methods by which electrical communication is established with substrate node locations. In particular, the invention arose out of concerns associated with shallow junction contacts where opening critical dimensions are less than or equal to 0.15 micron.

SUMMARY OF THE INVENTION

Methods of establishing electrical communication with substrate node locations, methods of forming DRAM circuitry, and semiconductor assemblies are described. In one implementation, a contact opening is formed over a substrate node location with which electrical communication is desired. The contact opening has a base over which a refractory metal layer is formed. A refractory metal silicide layer is formed over the refractory metal layer, and the substrate is exposed to conditions effective to convert the refractory metal layer to a refractory metal silicide. In one embodiment, the refractory metal layer and the refractory metal silicide layer are chemical vapor deposited. In another embodiment, the refractory metal silicide layer comprises a silicide of the refractory metal layer. In a preferred implementation, the refractory metal layer comprises titanium and the refractory metal silicide layer comprises titanium silicide. In another implementation, a composite layer is formed over a substrate and comprises an underlying refractory metal and an overlying silicide layer. The composite layer is annealed to react the underlying metal with a silicon-comprising substrate and form a refractory metal silicide of the underlying refractory metal in contact with the overlying silicide layer. The invention can achieve reductions in silicon consumption in the diffusion regions and maintain low source/drain diode leakage.

BRIEF DESCRIPTION OF THE DRAWINGS

Preferred embodiments of the invention are described below with reference to the following accompanying drawings.

FIG. 1 is a diagrammatic sectional view of a semiconductor wafer fragment in process in accordance with one embodiment of the invention.

FIG. 2 is a view of the FIG. 1 wafer fragment at a processing step subsequent to that shown in FIG. 1.

DETAILED DESCRIPTION OF THE PREFERRED EMBODIMENTS

Figure 3:
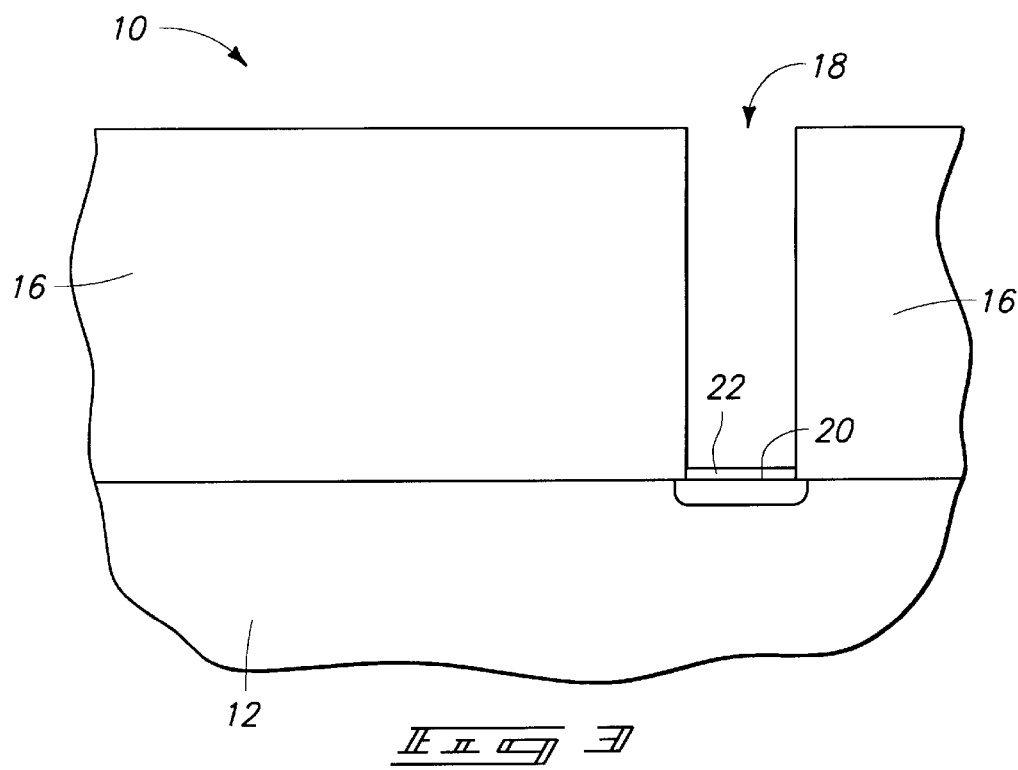
FIG. 3 is a view of the FIG. 1 wafer fragment at a processing step subsequent to that shown in FIG. 2.

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment in process is shown generally at 10 and comprises a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A diffusion region 14 is formed in substrate 12 and constitutes a node location with which electrical communication is desired. For purposes of the ongoing discussion, substrate 12 comprises a silicon-comprising or silicon-containing substrate. In the illustrated and preferred embodiment, diffusion region 14 has an elevational thickness $t_1$ of less than about 1,000 Angstroms.

Referring to FIG. 2, a layer of material 16 is formed over substrate 12, and a contact opening 18 is formed therethrough which exposes diffusion region 14. An example for layer 16 is borophosphosilicate glass (BPSG). Contact opening 18 is defined in part by a base 20. In a preferred embodiment, contact opening 18 has an aspect ratio greater than about six, and an inside narrowest opening dimension $D_1$ of less than about 0.25 micron, providing an inside diameter proximate a top of contact opening 18 of less than about 0.25 micron. At 0.15-micron device design rules, contact opening dimension $D_1$ is less than 0.25 micron.

Referring to FIG. 3, a refractory metal layer 22 is formed over base 20. Preferably, layer 22 is chemical vapor deposited over base 20. An exemplary and preferred material for layer 22 is titanium deposited to a thickness from between about 50 to 150 Angstroms. A deposition substantially selective to deposit only on silicon is preferred. The layer can be deposited using $TiCl_4$ and $H_2$.

Figure 4:
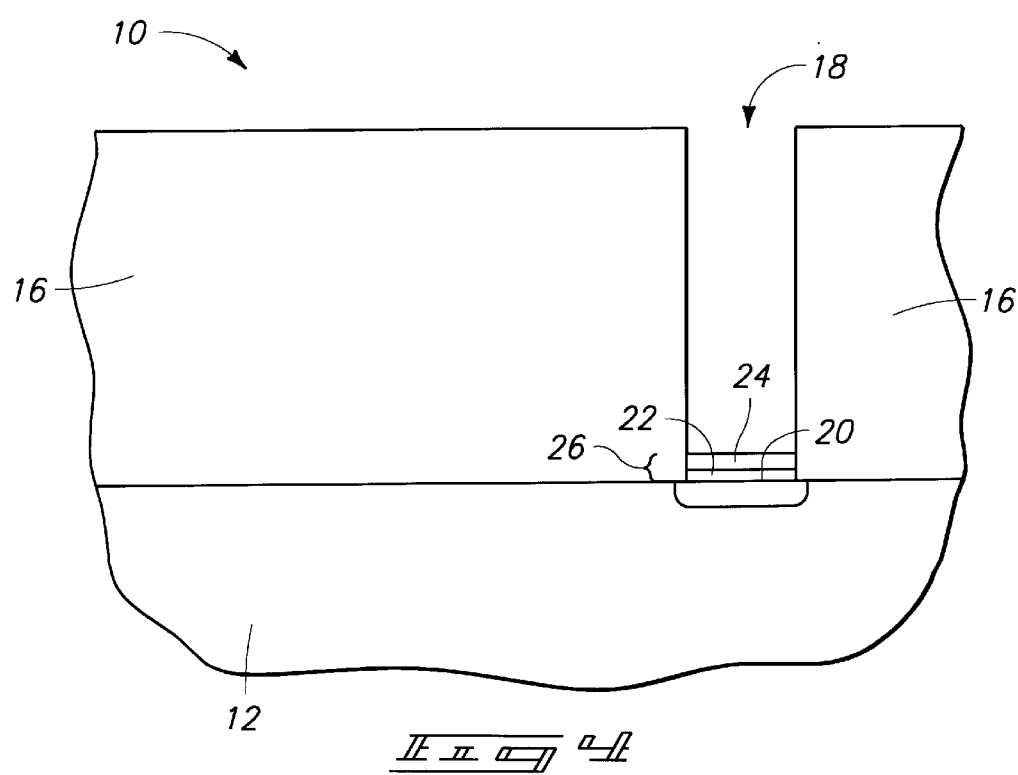
FIG. 4 is a view of the FIG. 1 wafer fragment at a processing step subsequent to that shown in FIG. 3.

Referring to FIG. 4, a refractory metal silicide layer 24 is formed over refractory metal layer 22. Preferably, layer 24 is chemical vapor deposited over layer 22. A deposition substantially selective to deposit only on refractory metal is preferred. In a most preferred embodiment, silicide layer 24 comprises a silicide of the refractory metal comprising layer 22. Accordingly, where layer 22 comprises titanium, an exemplary material for layer 24 comprises titanium silicide ($TiSi_x$). Preferably, is refractory metal silicide layer 24 is deposited to a thickness from between about 200 to 400 Angstroms. The layer can be deposited using $TiCl_4$ and $SiH_4$, or $TiCl_4$ and $SiH_2Cl_2$.

Layers 22, 24 might be considered as comprising a composite layer 26. The illustrated composite layer includes an underlying refractory metal layer 22, and an overlying silicide layer 24.

Figure 5:
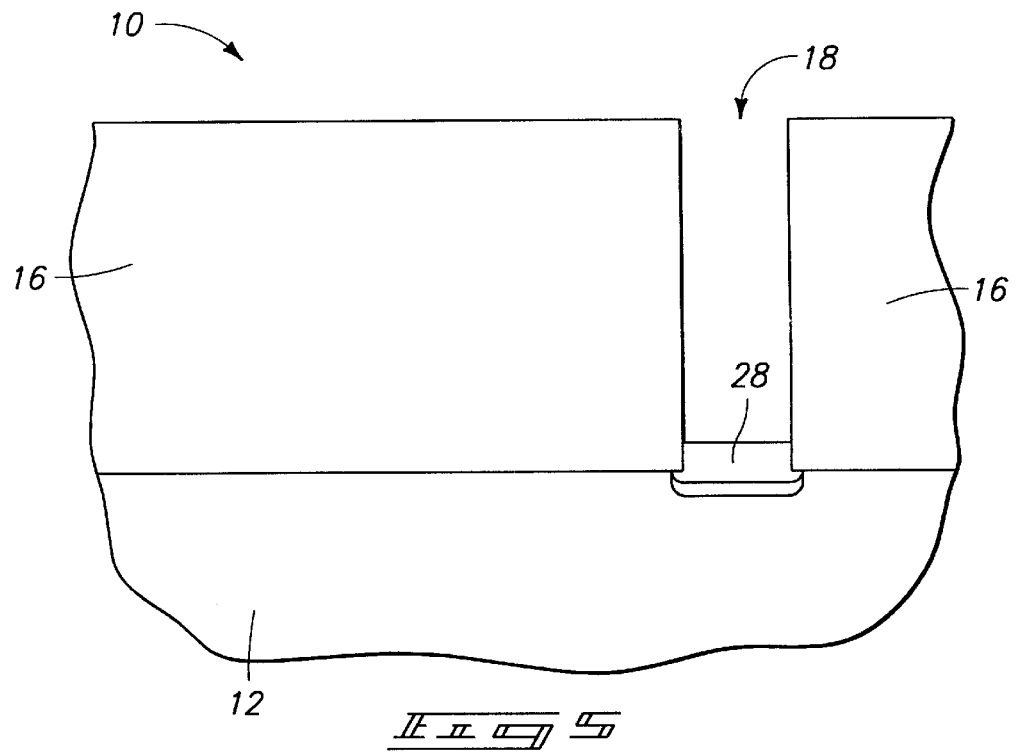
FIG. 5 is a view of the FIG. 1 wafer fragment at a processing step subsequent to that shown in FIG. 4.

Referring to FIG. 5, substrate 12 is exposed to conditions effective to convert refractory metal layer 22 to a refractory metal silicide layer 28. Such can occur by annealing substrate 12 at temperatures and for durations which are sufficient to form a refractory metal silicide of the underlying refractory metal in contact with the overlying silicide. For example, where layer 22 comprises titanium and layer 24 comprises titanium silicide, such annealing preferably takes place at temperatures from between about 500° C. to 800° C., in an $N_2$ ambient for between 10 to 20 seconds.

Figure 6:
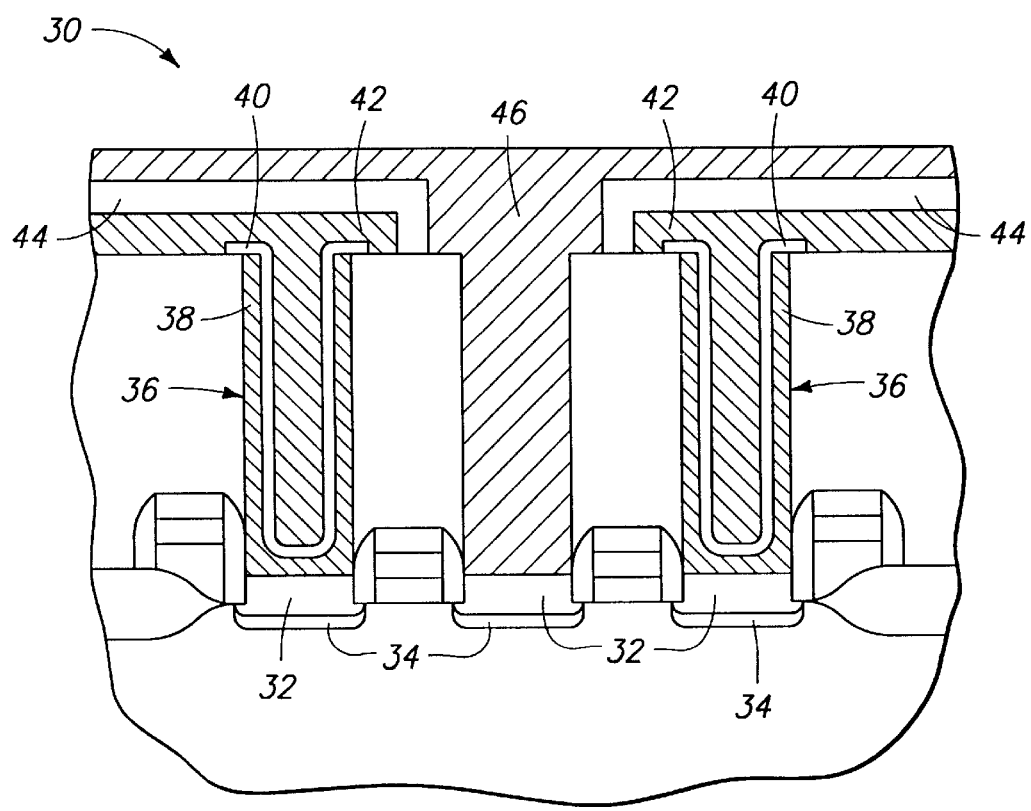
FIG. 6 is a diagrammatic sectional view of a semiconductor wafer fragment in process in accordance with a preferred embodiment of the present invention.

Referring to FIG. 6, a semiconductor wafer fragment 30 in process in accordance with a preferred embodiment of the present invention is shown. Fragment 30 constitutes a portion of a dynamic random access memory (DRAM) circuit. In the illustrated example, a plurality of single silicide layers 32 are received over corresponding diffusion regions 34. Silicide layers 32 are preferably formed in accordance with the methods described above. Exemplary storage capacitors are shown generally at 36 in electrical communication with respective silicide layers 32. The storage capacitors include a storage node layer 38, a dielectric layer 40, and a cell plate layer 42. An overlying insulative layer 44 is provided and an exemplary conductive bit line is shown at 46 in electrical communication with a corresponding silicide layer 32.

The above-described methods and structures can reduce the amounts of silicon which are consumed during conversion of refractory metals to refractory metal suicides. Additional advantages can be achieved in reducing native oxide formation at the refractory metal/silicon interface, achieving a smoother, more stable silicide/silicon interface, improving the ohmic contact area between the resultant silicide and silicon, producing finer grain silicides (e.g. 20–40 nm observed in atomic force microscope [AFM] and X-transmission electron microscopy [XTEM] studies), and reducing outdiffusion from the diffusion regions into the resultant silicide. Fine-grained silicides can reduce wormholes due to downstream processing including chemical vapor deposition of conductive materials such as tungsten.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of establishing electrical communication with a substrate node location comprising:

forming a contact opening over a substrate node location with which electrical communication is desired, the contact opening having a base and an aspect ratio greater than about six;

forming a refractory metal layer over the base;

forming a refractory metal silicide layer over the refractory metal layer; and exposing the substrate to conditions effective to convert the refractory metal layer to a refractory metal silicide.

2. The method of establishing electrical communication of claim 1, wherein the substrate node location comprises a diffusion region having an elevational thickness within the substrate of less than about 1000 Angstroms.

3. The method of establishing electrical communication of claim 1, wherein the forming of the contact opening comprises forming the opening to have an inside narrowest opening dimension of less than about 0.25 micron.

4. The method of establishing electrical communication of claim 1, wherein the forming of the refractory metal layer comprises chemical vapor depositing a layer comprising titanium over the node location to a thickness from between about 50 to 150 Angstroms.

5. The method of establishing electrical communication of claim 1, wherein the forming of the refractory metal silicide layer comprises chemical vapor depositing a refractory metal silicide layer of said refractory metal layer.

6. The method of establishing electrical communication of claim 5, wherein said refractory metal layer comprises titanium.

7. The method of establishing electrical communication of claim 1, wherein:

the forming of the refractory metal layer comprises chemical vapor depositing a refractory metal layer over the node location to a thickness from between about 50 to 150 Angstroms; and the forming of the refractory metal silicide layer comprises chemical vapor depositing a refractory metal silicide layer of said refractory metal layer having a thickness from between about 200 to 400 Angstroms.

8. The method of establishing electrical communication of claim 7, wherein the refractory metal layer comprises titanium.

9. The method of establishing electrical communication of claim 7, wherein the node location comprises a diffusion region having an elevational thickness within the substrate of less than about 1000 Angstroms.

10. The method of establishing electrical communication of claim 7, wherein the forming of the contact opening comprises forming the opening to have an inside narrowest opening dimension of less than about 0.25 micron.

11. The method of establishing electrical communication of claim 7, wherein:
   the node location comprises a diffusion region having an elevational thickness within the substrate of less than about 1000 Angstroms;
   the forming of the contact opening comprises forming the opening to have an inside narrowest opening dimension of less than about 0.25 micron; and
   the refractory metal layer comprises titanium.

12. A method of establishing electrical communication with a substrate node location comprising:
   forming a contact opening over a substrate node location with which electrical communication is desired, the contact opening having a base and an inside narrowest opening dimension proximate a top of the contact opening of less than about 0.25 micron;
   chemical vapor depositing a refractory metal layer over the base;
   chemical vapor depositing a refractory metal silicide layer over the refractory metal layer; and
   after the depositing of the refractory metal silicide, exposing the substrate to conditions effective to convert the refractory metal layer to a refractory metal silicide.

13. The method of establishing electrical communication of claim 12, wherein the substrate node location comprises a diffusion region having an elevational thickness within the substrate of less than about 1000 Angstroms.

14. The method of establishing electrical communication of claim 12, wherein the depositing of the refractory metal silicide layer comprises depositing a silicide layer of said refractory metal layer.

15. The method of establishing electrical communication of claim 12, wherein the depositing of the refractory metal layer comprises depositing a layer comprising titanium to a thickness from between about 50 to 150 Angstroms.

16. The method of establishing electrical communication of claim 12, wherein the depositing of the refractory metal silicide layer comprises depositing a layer comprising $TiSi_x$ to a thickness from between about 200 to 400 Angstroms.

17. The method of establishing electrical communication of claim 12, wherein:
   the depositing of the refractory metal layer comprises depositing a layer comprising titanium to a thickness from between about 50 to 150 Angstroms; and
   the depositing of the refractory metal silicide layer comprises depositing a layer comprising $TiSi_x$ to a thickness from between about 200 to 400 Angstroms.

18. The method of establishing electrical communication of claim 12, wherein the exposing of the substrate to said conditions comprises exposing the substrate to temperatures from between about 500° C. to 800° C. for between 10 to 20 seconds.

19. A method of establishing electrical communication with a substrate node location comprising:
   forming a contact opening over a substrate node location with which electrical communication is desired, the contact opening having a base and an inside narrowest opening diameter proximate a top of the contact opening of less than about 0.25 micron;
   forming a layer of titanium over the base;
   forming a layer comprising titanium silicide over the titanium layer; and
   exposing the substrate to conditions effective to convert material of the titanium layer to titanium silicide.

20. The method of establishing electrical communication of claim 19, wherein the forming of the layer of titanium comprises chemical vapor depositing said layer to a thickness from between about 50 to 150 Angstroms.

21. The method of establishing electrical communication of claim 19, wherein the forming of the layer comprising titanium silicide comprises chemical vapor depositing said layer to a thickness from between 200 to 400 Angstroms.

22. The method of establishing electrical communication of claim 19, wherein:
   the forming of the layer of titanium comprises chemical vapor depositing said layer to a thickness from between about 50 to 150 Angstroms; and
   the forming of the layer comprising titanium silicide comprises chemical vapor depositing said titanium silicide layer to a thickness from between 200 to 400 Angstroms.

23. The method of establishing electrical communication of claim 19, wherein the exposing of the substrate comprises exposing the substrate to temperatures from between about 500° C. to 800° C. for between 10 to 20 seconds.

24. The method of establishing electrical communication of claim 19, wherein:
   the substrate node location comprises a diffusion region having a thickness within the substrate no greater than about 1000 Angstroms;
   the forming of the layer of titanium comprises chemical vapor depositing said layer to a thickness from between about 50 to 150 Angstroms; and
   the forming of the layer comprising titanium silicide comprises chemical vapor depositing said titanium silicide layer to a thickness from between 200 to 400 Angstroms.

25. A method of establishing electrical communication with a substrate node location comprising:
   forming a contact opening over a substrate node location with which electrical communication is desired, the contact opening having a base and an aspect ratio greater than about six;
   forming a refractory metal layer over the base to a thickness of less than about 150 Angstroms;
   forming a refractory metal silicide layer over the refractory metal layer; and
   annealing the substrate at a temperature and for a duration effective to convert the refractory metal layer into a silicide.

26. The method of establishing electrical communication of claim 25, wherein the forming of the refractory metal layer comprises forming a layer comprising titanium over the base.

27. The method of establishing electrical communication of claim 25, wherein the forming of the refractory metal layer comprises chemical vapor depositing a layer comprising titanium over the base.

28. The method of establishing electrical communication of claim 25, wherein the forming of the refractory metal silicide layer comprises forming a silicide of said refractory metal layer.

29. The method of establishing electrical communication of claim 28, wherein said refractory metal layer comprises titanium.

30. The method of establishing electrical communication of claim 25, wherein the forming of the refractory metal silicide layer comprises chemical vapor depositing a silicide of said refractory metal layer.

31. The method of establishing electrical communication of claim 30, wherein the refractory metal layer comprises titanium.

32. The method of establishing electrical communication of claim 25, wherein the annealing of the substrate comprises annealing the substrate at temperatures from between about 500° C. to 800° C. for between 10 to 20 seconds.

33. A method of establishing electrical communication with a substrate node location comprising:
   forming a contact opening over a substrate node location with which electrical communication is desired, the contact opening having a base and an inside diameter proximate a top of the contact opening of less than about 0.25 micron;
   chemical vapor depositing a layer of titanium over the base;
   chemical vapor depositing a metal silicide layer over the layer of titanium; and
   exposing the substrate to conditions effective to convert material of the layer of titanium into titanium silicide.

34. The method of establishing electrical communication of claim 33, wherein the depositing of the layer of titanium comprising depositing said layer to a thickness from between about 50 to 150 Angstroms.

35. The method of establishing electrical communication of claim 33, wherein the depositing of the metal silicide layer comprises depositing said layer to a thickness from between about 200 to 400 Angstroms.

36. The method of establishing electrical communication of claim 33, wherein the depositing of the metal silicide layer comprises depositing a layer comprising $TiSi_x$.

37. The method of establishing electrical communication of claim 33, wherein the depositing of the metal silicide layer comprises depositing a layer comprising $TiSi_x$ to a thickness from between about 200 to 400 Angstroms.

38. The method of establishing electrical communication of claim 33, wherein the substrate node location comprises a diffusion region having an elevational thickness within the substrate of no greater than about 1000 Angstroms.

39. A method of establishing electrical communication with a substrate node location comprising:
   forming a composite layer comprising an underlying refractory metal and an overlying silicide of the refractory metal within a contact opening over a silicon-comprising substrate; and
   annealing the composite layer to react the underlying refractory metal with the silicon-comprising substrate and transform the composite layer into a single layer of the silicide of the refractory metal.

40. The method of establishing electrical communication of claim 39, wherein the refractory metal layer comprises titanium.

41. The method of establishing electrical communication of claim 39, wherein the forming of the composite layer comprises chemical vapor depositing one of the underlying and overlying layers.

42. The method of establishing electrical communication of claim 39, wherein the forming of the composite layer comprises chemical vapor depositing both of the underlying and overlying layers.

43. The method of establishing electrical communication of claim 39, wherein:
   the forming of the composite layer comprises chemical vapor depositing one of the underlying and overlying layers; and
   the refractory metal layer comprises titanium.

44. A method of establishing electrical communication with a substrate node location comprising:
   forming a composite layer comprising an underlying refractory metal and an overlying silicide of a refractory metal within a contact opening over a silicon-comprising substrate; and
   annealing the composite layer to react the underlying refractory metal with the silicon-comprising substrate and form a refractory metal silicide of the underlying refractory metal in contact with the overlying silicide.

45. The method of claim 44, wherein the overlying silicide comprises a silicide of the underlying refractory metal.

46. A method of establishing electrical communication with a substrate node location comprising:
   forming a diffusion region within a silicon-comprising substrate, the diffusion region having an elevational thickness within the substrate no greater than about 1000 Angstroms, the diffusion region defining a node location with which electrical communication is desired;
   forming a contact opening over the diffusion region;
   forming a composite layer comprising an underlying refractory metal and an overlying silicide of a refractory metal within the contact opening; and
   annealing the composite layer to react the underlying refractory metal with the silicon-comprising substrate and form a refractory metal silicide of the underlying refractory metal in contact with the overlying silicide.

47. The method of establishing electrical communication of claim 46, wherein the overlying silicide comprises a silicide of the underlying refractory metal.

48. The method of establishing electrical communication of claim 46, wherein the forming of the contact opening comprises forming said contact opening to have an aspect ratio greater than about six.

49. The method of establishing electrical communication of claim 46, wherein the refractory metal layer comprises titanium.

50. The method of establishing electrical communication of claim 46, wherein the forming of the contact opening comprises forming said contact opening to have an aspect ratio greater than about six, and wherein the refractory metal layer comprises titanium.

51. A semiconductor processing method of forming DRAM circuitry comprising:
   providing a silicon-comprising substrate having a diffusion region with which electrical communication is desired;
   forming a contact opening over the diffusion region;
   forming a composite layer comprising an underlying refractory metal and an overlying silicide of a refractory metal within the contact opening;
   annealing the composite layer to react the underlying refractory metal with the silicon-comprising substrate and form a refractory metal silicide of the underlying refractory metal in contact with the overlying silicide; and
   forming at least one of a bit line and a storage capacitor over the silicide of the refractory metal and in electrical communication therewith.

52. The semiconductor processing method of claim 51, wherein the overlying silicide comprises a silicide of the underlying refractory metal.

53. The semiconductor processing method of claim 52, wherein the forming of the composite layer comprises forming an underlying layer comprising titanium.

54. The semiconductor processing method of claim 52, wherein the forming of the composite layer comprises chemical vapor depositing an underlying layer comprising titanium.

55. A semiconductor assembly comprising:
   a silicon-containing substrate;

a diffusion region received within the substrate and having an elevational thickness therewithin no greater than about 1000 Angstroms;

a refractory metal layer received over the diffusion region and having an elevational thickness thereover between about 50 to 150 Angstroms; and a silicide layer of the refractory metal received over the refractory metal layer and having an elevational thickness thereover between about 200 to 400 Angstroms.

\* \* \* \* \*